United States Patent [19]
Haag et al.

[11] Patent Number: 5,717,699
[45] Date of Patent: Feb. 10, 1998

[54] METHOD AND APPARATUS FOR ACCESSING INTERNAL INTEGRATED CIRCUIT SIGNALS

[75] Inventors: George A. Haag; Patrick J. Byrne, both of Colorado Springs, Colo.

[73] Assignee: Hewlett-Packard Company, Palo Alto, Calif.

[21] Appl. No.: 683,484

[22] Filed: Jul. 18, 1996

[51] Int. Cl.$^6$ .................................................. G06F 11/00

[52] U.S. Cl. .................................................. 371/22.2

[58] Field of Search .................... 371/22.2, 22.1, 371/22.5, 22.6, 27, 24; 395/183.04, 183.06; 324/158 R

[56] References Cited

U.S. PATENT DOCUMENTS

| | | | |
|---|---|---|---|
| 4,853,626 | 8/1989 | Resler | 324/158 |
| 5,621,312 | 4/1997 | Achor et al. | 324/158.1 |

*Primary Examiner*—Vincent P. Canney
*Attorney, Agent, or Firm*—Patrick J. Murphy

[57] ABSTRACT

A method and apparatus for analyzing a programmable logic device (PLD) that provides access to internal nodes of the circuit. The method and apparatus in accordance with the present invention uses a shadow programmable logic device to emulate the target PLD while coupling input and output terminals of the shadow PLD so as to provide more information about the target PLD than can be obtained from the target PLD itself. Also, the shadow PLD can implement internal stimulus and/or response functions to provide improve analyzing capability not possible with the target PLD alone.

11 Claims, 5 Drawing Sheets

METHOD AND APPARATUS FOR ACCESSING INTERNAL INTEGRATED CIRCUIT SIGNALS

FIELD OF THE INVENTION

The present invention relates, in general, to electronic circuit testing, and, more particularly, to a method and apparatus for analyzing integrated circuits to provide access to a large number of internal nodes not connected to device terminals.

BACKGROUND OF THE INVENTION

A trend in electronic circuits in general and integrated circuits in particular is increasing complexity and functionality within an individual integrated circuit device. It is widely recognized that as the internal circuitry of an integrated circuit increases in complexity, testing and analysis of the integrated circuit becomes more important. However, integrated circuits have a limited number of device terminals (i.e., external metallic connections for accessing the integrated circuit within a packaged integrated circuit). Device terminals are also commonly referred to as "pins", "pads," or "leads". Typically, each device terminal accesses one or perhaps a few internal nodes. The device terminals provide input, output, or bi-directional input/output (I/O) for the internal circuit cells. Additionally, some of the device terminals must be dedicated for applying power to the integrated circuit.

Programmable logic devices (PLDs) are a class of devices that can be programmed to perform a wide variety of logic functions determined by the end user. Some PLDs can only be programmed one time by burning fuses (i.e., removing conductive links) to alter the configuration of the devices. Other PLDs, such as field programmable gate arrays (FPGAs), can be reprogrammed any number of times. PLDs are increasingly popular because they allow complex circuits to be implemented in a few devices that are tailored to provide the necessary functionality and timing requirements.

The design, analysis, and programming of a PLD is performed with a software application running on a computer. The design is entered as a schematic diagram with a graphic entry package or as a text file in a hardware descriptive language. The circuit is then analyzed using simulation packages to verify that its functional and timing properties are as intended. The place and route package is then utilized to translate that circuit into a form that can be programmed and down loaded into the PLD. Hopefully, the configured PLD behaves like the designer's theoretical understanding as well as like the simulations. However, this process often has unsatisfactory results, with uncertainty in determining why PLD behavior differs from theoretical or simulated behavior. A considerable number of retries and total development time are often required to complete the PLD design.

Simulation allows the designer to examine circuit behavior at any node within the design. There are two types of behavioral properties that are examined: (1) functional and (2) timing or performance. Functional analysis is the operational examination of the circuit. Timing behavioral analysis is the examination of the speed and signal delay/rise/fall time the circuit exhibits. The circuit's timing/performance must be within the required specifications. The simulation program creates a mathematical model of the circuit being designed using estimates of the actual performance of the PLD in which the circuit will be placed. Simulation programs are reasonably accurate for the PLD functional simulation. However, they become inaccurate due to incomplete modeling of the external circuits with which the PLD is connected and operating (e.g., microprocessor, memory, disc, interface with another synchronous or asynchronous entity).

However, it is very difficult to simulate the timing performance of a design because of the large number of factors that affect timing in the PLD. It takes a great deal of computational time to accurately estimate values for these factors. Further, as more variables are accounted for in the simulation, the simulation program takes longer to run. It is not uncommon for a complete and accurate simulation to take several days to run even with high-speed computers. Accurate timing simulation may or may not be available and is typically expensive and slow in execution.

A necessary step in the process of designing circuits for implementation in PLDs is evaluating the programmed PLD to ensure that it meets design specifications. Preferably, a PLD is programmed and coupled to the circuit(s) with which it must operate. In-circuit evaluation allows the designed circuit to be analyzed under the actual conditions for which it is intended. Usually, the design process is iterative in that the programmed PLD does not perform ideally on the first attempt. With each iteration, the PLD behavior must be analyzed to determine where any design deficiencies exist. These deficiencies are corrected, and a new PLD is programmed (or the PLD is reprogrammed) and the evaluation repeated.

Simple circuits can be implemented in a PLD and their behavior analyzed by testing for desired outputs from the PLD in response to known input conditions. For these simple designs, it may be possible to analyze an incorrect output and identify its cause while using only the data available on the PLD terminals. However, for more complex designs, an incorrect response at a given cell output may be caused by a problem with internal unported cells of a multiple cell design. Because of the limited number of output PLD terminals, or a limited number of internal trace routing channels, these internal cells are not accessible. In the past, analysis of the PLD relied on guess work, intuition, and time-consuming manual analysis. Alternatively, the designer could rely on computer simulation to analyze the internal nodes. Any inaccurate simulation efforts misled or do not correlate to the failing behavior of the PLD in the prototype or final product environment.

Another technique is to design in testability in the integrated circuit. Using this technique, some of the limited number of PLD or FPGA cells and terminals are dedicated to test and analysis functions that provide direct or indirect access to critical internal cells. Obviously, the number of internal nodes that can be accessed is severely limited by the number of device terminals available. Also, once the analysis is complete these terminals often serve no function for the integrated circuit and are simply wasted device components. This increases the cost of the integrated circuit to the consumer. Moreover, designing these features places an additional constraint on the design of the integrated circuit that affects device size or cell count, layout, functionality, and timing characteristics of the integrated circuit. A need exists for an integrated circuit apparatus and method with improved accessibility to internal cells in the prototype or final circuit environment.

SUMMARY OF THE INVENTION

Briefly stated, the present invention provides an apparatus and method for analyzing a target PLD, the target PLD programmed to implement an electronic circuit design and having an internal configuration selected to have particular functional and timing characteristic. The apparatus provides a convenient connection to the target PLD for external measurement devices such as oscilloscopes and state or logic analyzers.

The target PLD has a plurality of input, output, and bi-directional input/output (I/O) terminals. The apparatus comprises a means for emulating the target PLD where the means for emulating has a plurality of input terminals, most of which correspond to the input terminals of the target PLD. The means for emulating also includes a plurality of unique output terminals. The apparatus further comprises a means for coupling the input terminals of both the target PLD and the means for emulating to external circuitry with which the target PLD must operate. The apparatus further comprises a first means for receiving all signals from the terminals of the target PLD and a second means for receiving signals from the unique terminals of the means for emulating. By providing accessibility to the unique terminals, analysis is greatly simplified and identifying faults with internal nodes is greatly improved.

In one preferred embodiment, the present apparatus may comprise a socketed shadow integrated circuit (IC) which emulates the target PLD, the target output terminals drive its normal home environment while the shadow IC's output terminals are programmed to monitor the input terminals of the target PLD. The apparatus may also comprise (i) a set of measurement instrument probe connectors which may contain all target PLD I/O and all shadow output pins and (ii) a set of electrical interconnections.

The present invention may also be viewed as a method for analyzing a target PLD, the target PLD having a number of programmable circuit blocks, a plurality of inaccessible internal nodes, and a plurality of I/O terminals wherein the plurality of inaccessible nodes are inaccessible to the plurality of I/O terminals when the target PLD is programmed.

DETAILED DESCRIPTION OF THE PREFERRED EMBODIMENT

The difficulties of the prior art are solved by a method and apparatus for analyzing electronic circuits that emulates rather than simulates a target PLD. In accordance with a preferred embodiment, a target PLD 104 (shown in FIG. 1–FIG. 5) is emulated by a shadow PLD such as PLD 304 in FIG. 2 and FIG. 3, shadow PLD 404 in FIG. 4, and shadow PLD 504 in FIG. 5. Both target PLD 104 and shadow PLD 304 are intended to be placed in a prototype circuit or final circuit environment. Target PLD 104 includes I/O terminals coupled to the prototype or final circuit hence target PLD 104 drives the prototype or final circuit. In contrast, at least some I/O terminals of shadow PLD 304 as well as any other unused pins of shadow PLD 304 are available to drive or monitor internal cell nodes that are normally unported in target PLD 104.

Shadow PLD 304 is preferably configured to be functionally and/or parametrically identical to target PLD 104. Hence, shadow PLD 304 is subject to exactly the same environmental and timing constraints as target PLD 104. In accordance with the present invention, measurement instruments can now monitor all I/O terminals of target PLD 104 as well as drive or monitor a large set of emulated internal cells nodes through the I/O terminals of shadow device 304.

Shadow PLD 304 can be implemented by multiple internal cell sets programmed into a reprogrammable or several one-time programmable devices. Consequently, all internal nodes can be accessed. A considerable number of these otherwise inaccessible internal nodes may be accessed simultaneously with the target and shadow devices having the same size. More internal nodes can be accessed if shadow PLD 304 is selected with more I/O terminals than target PLD 104. Hence, shadow PLD 304 in accordance with the present invention enables detailed behavioral analysis of a target PLD 104 while it is operating in-circuit with all other circuits necessary for a given application.

Figure 1:
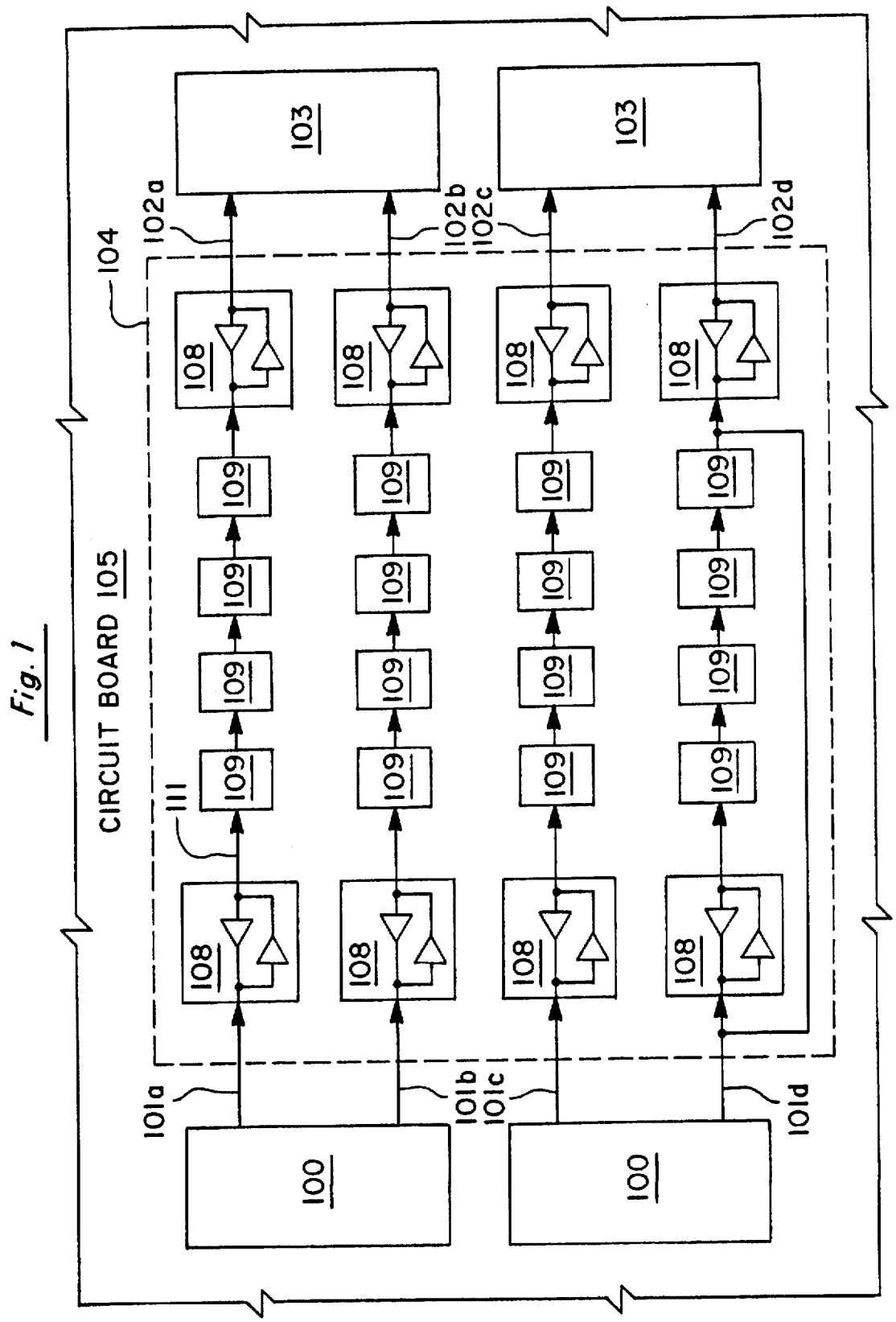
FIG. 1 shows a prior art programmable logic device in block diagram form.

FIG. 1 shows a prior art programmable integrated circuit or programmable logic device (PLD) herein referred to as target PLD 104 coupled to interact with external circuits 100 and 103 on a circuit board 105. It should be understood that FIG. 1 is a highly simplified representation of PLD 104 and circuit board 105. External circuits 100 provide inputs to PLD 104 while external circuits 103 receive outputs from PLD 104. In most applications, some external circuits (not shown) will both provide inputs to PLD 104 and receive outputs from PLD 104. The simplified representation of FIG. 1 is not a limitation on the present invention.

Input terminals 101a–101d are typically coupled through bi-directional input/output buffers 108 to internal circuit blocks 109. For purposes of the present invention, the particular configuration of PLD 104 is not important. For purposes of the present invention, a PLD includes any device comprising a plurality of circuit blocks 109 that are connected together by internal nodes such as node 111. PLD 104 represents any of a variety of commercially available programmable logic devices that also includes device types referenced as field programmable gate array (FPGA), programmed array logic (PAL), programmable logic array (PLA), or the like.

Circuit blocks 109 each comprise at least one input node indicated as arrows pointing towards each circuit block 109. Also, each circuit block one includes at least one output node represented by arrows pointing away from each circuit block 109. Circuit blocks 109 process data supplied from input terminals 101a–101d and supply the processed data to selected ones of I/O buffers 108. An output node of at least one logic block 109 is coupled to an I/O buffer 108 to provide an output signal on output terminals 102a–102d.

FIG. 1 is a highly simplified structure having all of the inputs 101a–101d aligned on one side of PLD 104 and all of the outputs aligned on an opposite side of PLD 104. It should be understood that this arrangement is solely for purposes of illustration. In practical applications, each of I/O blocks 108 may have a mixture of input, output, and bi-directional I/O buffers interconnected to any set of circuit blocks 109. Also, the interconnections between circuit blocks 109 will be more complicated than only to its neighbor, since the outputs of any logic block 109 can be coupled to the inputs of any other logic block 109 or I/O buffer 108. These features of complex PLD design are well known and will not be described in greater detail hereinafter.

It should be understood that the PLD 104 may be of any semiconductor technology, including CMOS, TTL, ECL, or the like. Further, the apparatus in accordance with the present invention can be circuit blocks of any type, including digital, analog, or mixed-circuit types. Also, in accordance with the present invention PLD 104 may be a single chip integrated circuit, a multi-chip module, or the like. I/O blocks 108 may be bi-directional, as shown, or some or all of I/O blocks 108 may be unidirectional inputs or outputs depending on the particular design chosen by the PLD manufacturer. For ease of illustration, only the data portions of PLD 104 are shown. It should be understood that each PLD 104 requires means for applying power and ground connections, as well as some means for programming circuit blocks 109 and the programmable interconnections between circuit blocks 109. The power, ground, and programming features are specific to the manufacturer of the PLD and are not a feature or limitation of the present invention. For any particular PLD, these requirements of a functioning PLD 104 will be apparent by reference to the manufacturer's data sheet.

Figure 2:
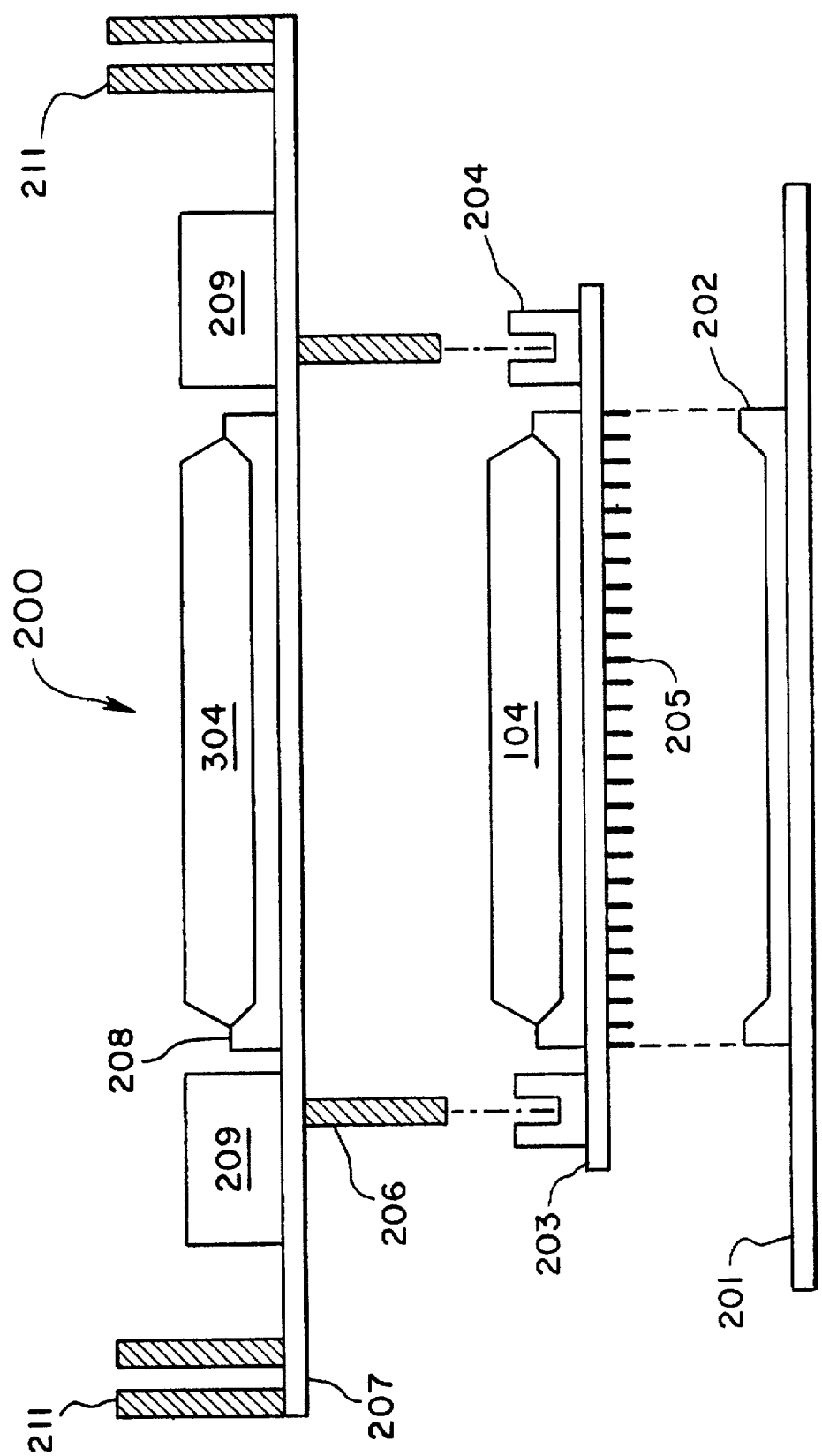
FIG. 2 shows a simplified cross-sectional view of an apparatus in accordance with the present invention.

FIG. 2 illustrates a block diagram of an adapter set 200 in accordance with the present invention. Circuit board 201 represents any circuit board that is designed to include a PLD-like integrated circuit such as target PLD 104 that needs to be analyzed. Circuit board 201 can be manufactured as a conventional circuit board that preferably contains an integrated circuit socket 202 sized to receive, connect to, and hold target PLD 104. Other circuitry, not shown, would be mounted on circuit board 201 either directly or using sockets similar to socket 202. One or more layers of wiring are formed on circuit board 201 to interconnect its components.

Target PLD 104 would normally be mounted directly in socket 202. However, in accordance with the present invention, target PLD 104 is mounted in socket 212 on a first adapter board 203. Adapter board 203 includes socket 212 that is similar to socket 202 for receiving and making electrical connection to I/O terminals (not shown) of PLD 104. A connection plug or extender boards comprising a plurality of pins 205 mounts and electrically connects the adapter board 203 to socket 202.

Connectors 204 comprise a plurality of individual electrical connection points (not shown) and are mounted on adapter board 203. Wiring is formed on adapter board 203 using printed circuit board processing methods, or their equivalent, to electrically couple the individual electrical connection to socket 212. In this manner, the individual connection points of connectors 204 are electrically coupled to the I/O terminals of target PLD 104 when it is placed in socket 212.

A second double-sided adapter board 207 is provided to hold and support electrical connection to shadow PLD 304. Adapter board 207 is easily formed using double-sided PC board methods and comprises a plurality of traces or wires for interconnecting elements mounted to both the bottom surface and top surface of adapter board 207.

Connectors 206 include a plurality of connection points or metal traces that are adapted to electrically couple with the individual connection points of connectors 204 thereby making an electrical connection between the I/O terminals of target PLD 104 and adapter board 207. Preferably, the number of pins or traces 205 matches the number of connections provided by connectors 204 and 206 that also match the number of I/O terminals on target PLD 104.

Connectors 206 are coupled by printed wiring and/or plated vias through adapter board 207 to switch devices 209.

Switches 209 are also coupled by printed wiring or the equivalent to socket 208, which holds and makes electrical connection to individual I/O terminals of shadow PLD 304. Switches 209 serve to selectively connect individual I/O terminals of shadow PLD 304 with individual I/O terminals of target PLD 104. Switches 209 also couple selected ones of I/O terminals of shadow PLD 304 and target PLD 104 to instrument probe pins 211.

Switches 209 make adapter 207 a general purpose adapter that can be configured to match the user-configurable I/O placement given to target PLD 104. Switches 209 may be provided by banks of dual-in-line pin (DIP) switches. Alternatively, low-impedance, low-noise semiconductor switches or relays may be used to implement switches 209. Optionally, well-known circuitry, not shown, may be used to electrically program switches 209.

Probe pins 211 are adapted to allow a user to couple instruments such as oscilloscopes, logic analyzers, and the like to selected device I/O terminals of target PLD 104 and/or shadow PLD 304. Also, probe pins 211 can be used to couple external drive circuitry such as a clock or function generator to individual I/O terminals.

FIG. 2 demonstrates how adapter set 200 in accordance with the present invention allows shadow PLD 304 to be custom coupled in parallel with target PLD 104. Each I/O terminal of either or both of PLDs 104 and 304 is conveniently probed by appropriate measurement instrumentation coupled to probe pins 211. For ease of illustration and description, all power lines necessary to power the target 104 and shadow 304 PLDs are not illustrated or described. Through similar versatile and convenient coupling means, PLD power device terminals are handled as well as the signal device terminals specifically described above.

Figure 3:
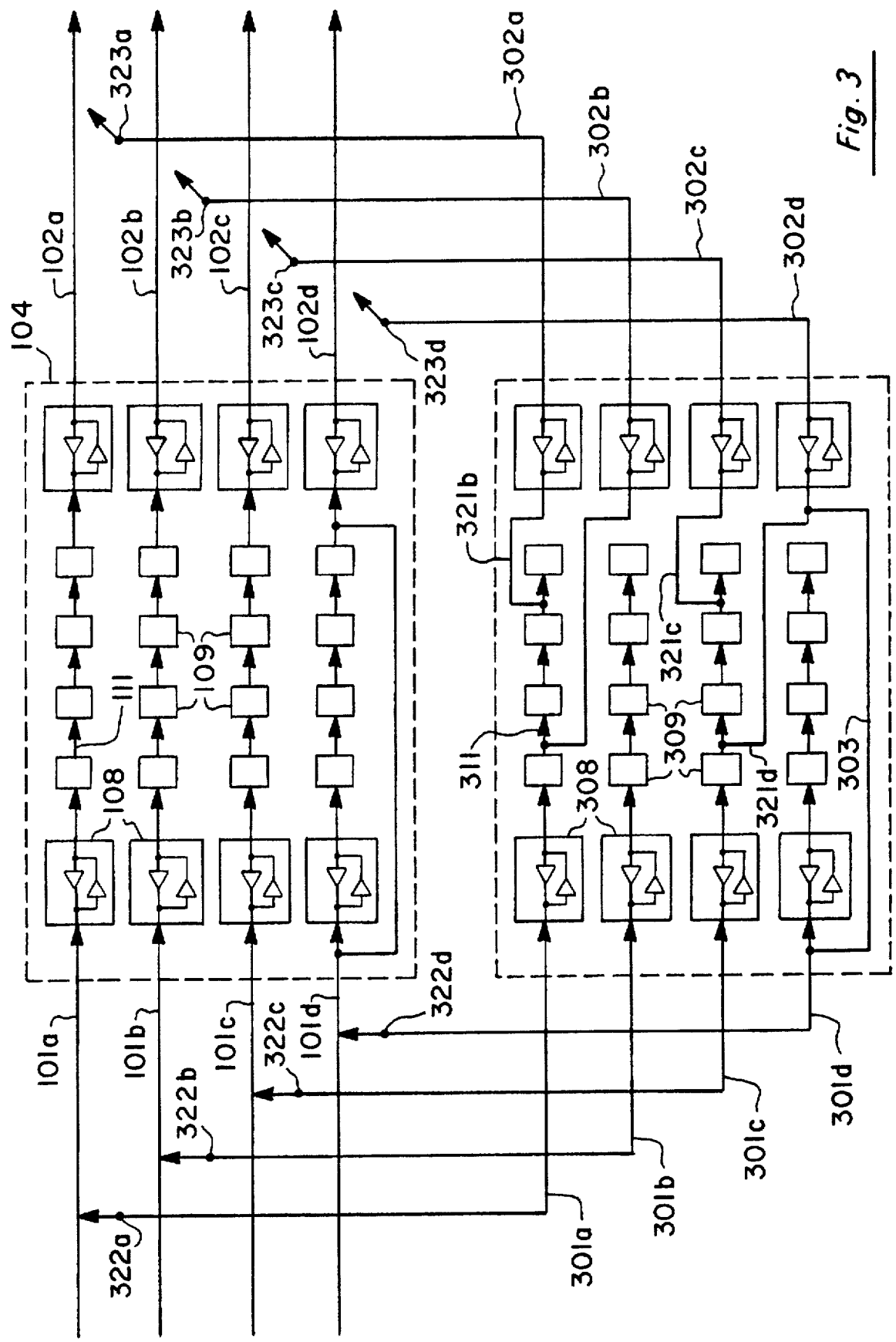
FIG. 3 shows a block diagram of a first embodiment in accordance with the present invention.

FIG. 3 illustrates an exemplary circuit using the method and apparatus in accordance with the present invention. In the particular example illustrated in FIG. 3, PLD 104 is the target device of a measurement analysis for design confirmation or a later problem isolation and correction effort. Target PLD 104 comprises an FPGA circuit having a plurality of configurable circuit block 109 coupled by configurable interconnect nodes 111. The highly simplified target PLD 104 includes only very simple interconnections; however, it must be understood that very complex interconnections are contemplated. A typical target PLD 104 will have several hundred circuit blocks 109. The teachings of the present invention are scalable to any size PLD 104. PLD 104 may be realized in a single integrated circuit, or in a multiple integrated circuit together with discrete components coupled together on a hybrid module, multi-chip module, or the like.

PLD 104 includes many internal nodes such as node 111 that do not have any direct access to output terminals 102a–102d. Nor do these internal nodes have access to input terminals such as terminals 101a–101d. Because of this, functional and/or AC (timing) analysis of shadow PLD 104 is greatly limited, as described hereinbefore, using conventional analysis technology based only on data that is available at output terminals 102a–102d.

In accordance with the present invention, shadow PLD 304 is configurable in that it can be programmed to emulate either the functionality of PLD 104, the timing of PLD 104, or both. It is desirable that shadow PLD 304 have a similar or greater number of circuit blocks 309 compared to target PLD 104. Further, it is desirable that shadow PLD 304 comprises internal evaluation circuitry that is coupled to the electronic circuit design implemented in the target PLD 104.

Likewise, it is desirable that shadow PLD 304 have as many or more I/O terminals (i.e., terminals 301a–301d and 302a–302d) as does target PLD 104. Further, the number and arrangement of I/O blocks 308 should correspond to the number and arrangement of I/O blocks 108 in target PLD 104. The interconnections between circuit blocks 309 are similar to the interconnections between circuit blocks 109.

In other words, shadow PLD 304 is configured to have circuit blocks 309 that function similarly to circuit blocks 109. By "similar" it is intended that the interconnection and functionality of shadow PLD 304 is sufficiently identical to the interconnection and functionality of target PLD 104 to satisfy the accuracy and resolution of the analysis that is to be performed.

Shadow PLD 304 is programmed to emulate target PLD 104. To serve this function, it desirable that many of the I/O terminals of target PLD 104, such as terminals 101a–101d, be coupled to analogous I/O terminals, such as 301a–301d of shadow PLD 304. This is because the functionality of shadow PLD 304 depends on the stimulus data received. For shadow PLD 304 to emulate all of the functionality of target PLD 104, it must receive similar stimulus data. To accomplish this, I/O terminals 301a–301d are coupled to input terminals 101a–101d by closing switches 322a–322d. The switches 322a–322d and 323a–323d shown in FIG. 3 are an example of a particular implementation of switches 209 shown in FIG. 2.

I/O terminals 102a–102d in the example of FIG. 3 provide output data or response vectors from target PLD 104 in a conventional manner. The output data from output terminals 102a–102d comprise a first set of output data. In accordance with the present invention, output terminals 302a–302d are decoupled from output terminals 102a–102d by switches 332a–323d so as to provide electrically independent output data. Also, shadow PLD 304 is configured differently from target PLD 104 so that output terminals 302a–302d are coupled to internal nodes such as nodes 321a–321d. This is accomplished easily when shadow PLD 304 is an FPGA or other configurable logic device.

It is necessary to generate two sets of configuration data to account for the differences between target PLD 104 and shadow PLD 304. While this requirement increases the complexity of the configuration process somewhat, the benefits of access to internal nodes greatly outweighs the costs of increased complexity.

It is desirable to configure shadow PLD 304 to emulate the timing characteristics as well as the functional characteristics of target PLD 104. When the target PLD is a programmable circuit such as an FPGA, timing or parametric emulation can be accomplished by forcing the configuration software (i.e., the software that converts a schematic circuit design into configuration instructions for the PLDs) to consider routing the shadow device interconnects as equivalent as possible to the routing of the target device. These modifications can be accomplished by using existing software tools that allow a designer to establish layout constraints (i.e., (1) fix design elements into the same specific circuit blocks or (2) use the target layout as a guide for the shadow layout). Once these layout constraints are established, the conventional software can be allowed to route the design of the shadow PLD 304 according to the specific place and route methods embodied in the software.

In the embodiment shown in FIG. 3, shadow PLD 304 is used entirely to provide additional outputs coupled to otherwise inaccessible nodes 311. In some applications it may be desirable to supply substitute or auxiliary input signals to unported circuit blocks. This could enable or speed the isolation of a problem cause or allow comparative examination of an alternate design.

Figure 4:
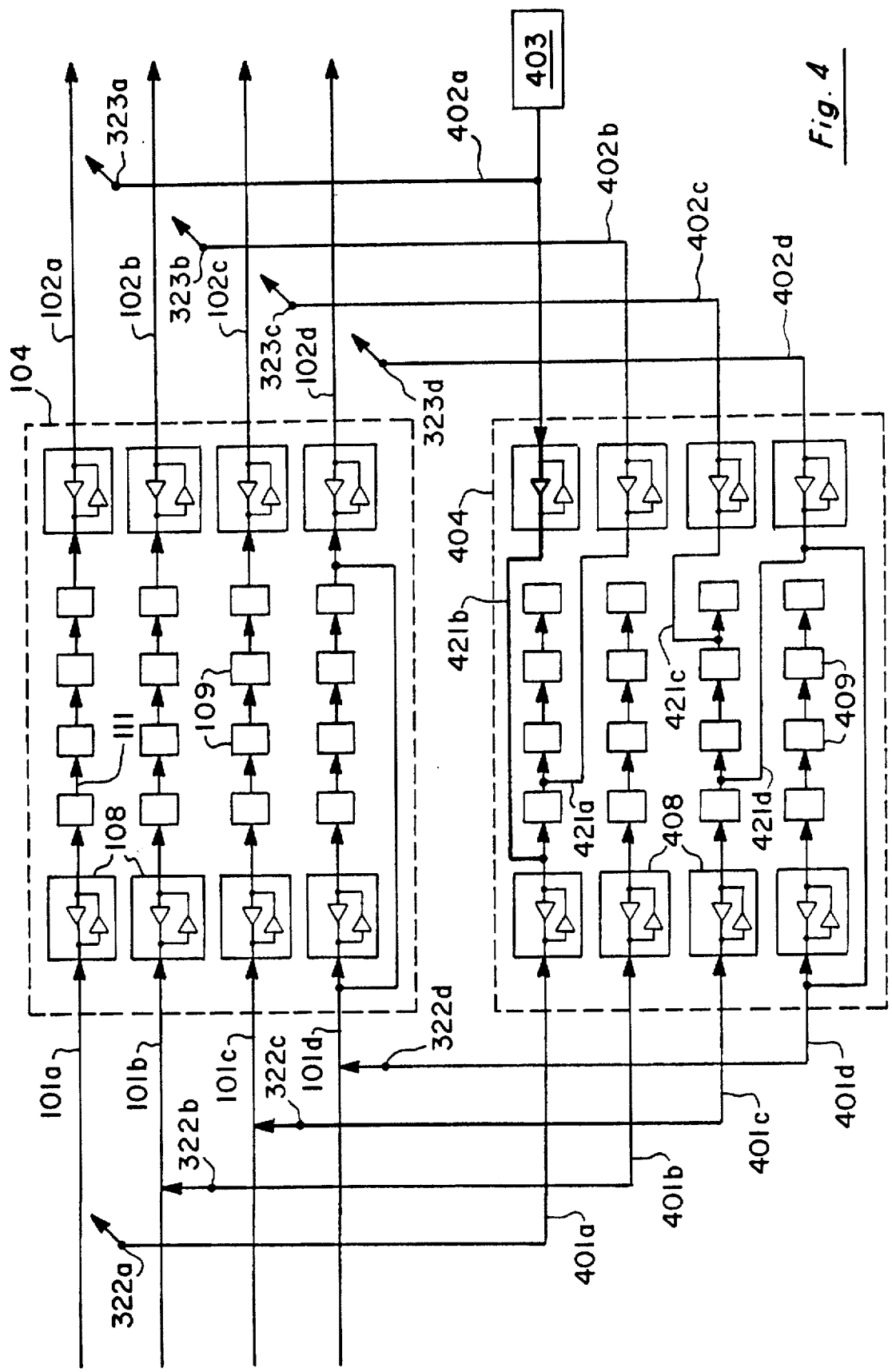
FIG. 4 shows a block diagram of a second embodiment in accordance with the present invention.

As shown in FIG. 4, shadow PLD 404 comprises a plurality of configurable circuit blocks 409 interconnected together. In the second embodiment, shadow PLD 404 is an FPGA or the like. In the second embodiment, one I/O block 408 on I/O pin 402a, illustrated in bold in FIG. 4, is coupled to replace or work in conjunction with the input signal coming from input pin 401a. In FIG. 4, the remaining portions of shadow PLD 404, including each of the configurable circuit blocks 409, are configured to emulate target PLD 104. Consequently, the method and apparatus of the present invention provide both additional outputs and additional inputs to speed analysis of target PLD 104.

In a particular example, instrumentation 403 is coupled to I/O pin 402a. Instrumentation 403 may be stimulus instrumentation adapted to provide data streams into shadow PLD 404 that would be difficult to provide through the external circuitry coupled to I/O line 401a. Alternatively, instrumentation 403 may be run control instrumentation that provides convenient or unique control signals during analysis. Instrumentation 403 may also be configured to capture either analog or digital data from an internal node of shadow PLD 404.

Although only one additional input is shown in FIG. 4, it should be understood that any number of additional inputs may be provided depending on the number of input terminals 401a–401d and output terminals 402a–402d available in shadow PLD 404. The particular implementation chosen is flexible enough to adapt to the particular requirements and resources available in a development, fabrication, or customer application environment.

In some applications it may not be necessary to emulate all of the circuitry programmed into target PLD 104 to completely analyze a problem. For example, some distinct first group of logic elements, such as group 125 shown in a dashed-line box in FIG. 5, may operate independently of the remainder of the circuit implemented in target PLD 104. It may also be the case that the circuitry in group 125 is easily tested or formerly equivalently used and analyzed. In such a case, it is possible to functionally and somewhat parametrically emulate the remainder portion of target PLD 104 without the normal function resident in the proven logic elements 125. Hence, a group of logic elements 525 is available in the shadow PLD 504 to implement other functions.

Figure 5:
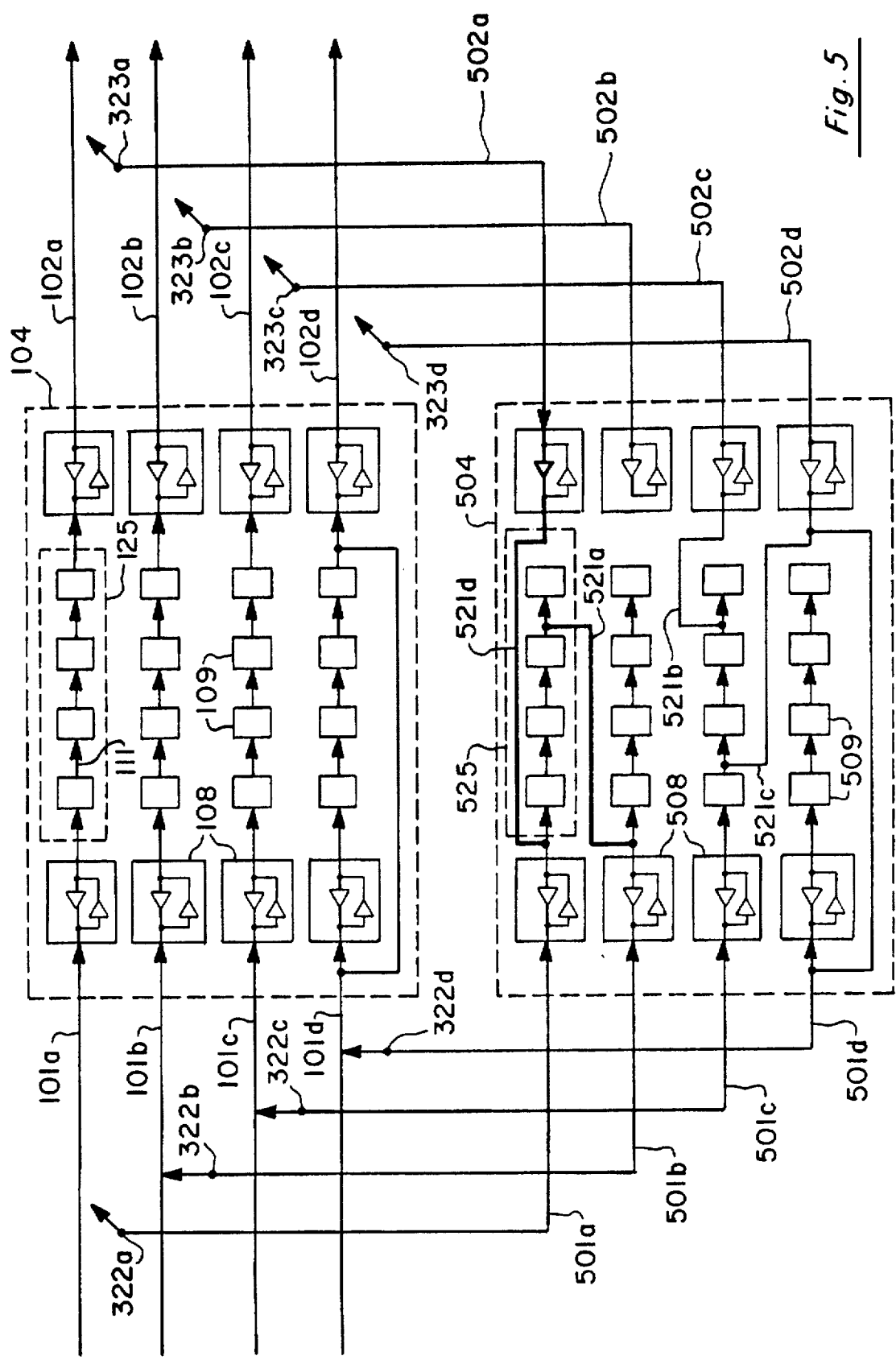
FIG. 5 illustrates a block diagram of a third embodiment in accordance with the present invention.

To accomplish this, switches 322a–322d allow selective coupling between shadow input pins 501a–501d and target input terminals 101a–101d. Switch 322a is opened to decouple the stimulus signal on input terminal 501a from input terminal 101a of shadow PLD 504. An output terminal 502a is reconfigured to inject a signal into an internal node of logic cell group 525. Group 525 is configured to provide a special internal function (i.e., not configured to emulate group 125 in the target PLD). As shown in FIG. 5, the function results in a faster, or wider, or more involved stimulus vector provided to replace the stimulus vector on line 101a.

This embodiment of the present invention allows stimulus circuits such as pattern generators and/or response monitoring/packing circuits such as counters or state machines to be implemented in the shadow PLD 504 rather than as external circuits. This feature can result in higher speed or accuracy in measurements than external equipment since the internal function is (1) closer to the analyzed circuit block or (2) the slowest speed elements are removed (external I/O) or (3) implemented using speed-enhancing parallel design methods. Special function serial to parallel transformations also could reduce the I/O blocks and pins necessary for testing.

In summary, the present invention teaches a method and apparatus for analyzing circuit designs that are implemented in a programmable logic device. The method and apparatus in accordance with the present invention provide access to internal nodes of the circuit. The method and apparatus in accordance with the present invention use a shadow PLD to emulate the target PLD being analyzed while coupling input and output terminals of the shadow PLD so as to provide more information about the PLD being analyzed than can be obtained from the target itself. Also, the configurable logic device can implement circuitry to provide improved analysis capability not possible with the PLD under analysis alone. It is to be expressly understood that the claimed invention is not to be limited to the description of the several preferred embodiments but encompasses other modifications and alterations within the scope and spirit of the inventive concept.

We claim:

1. An apparatus for in-circuit analysis by external measurement instruments of a target programmable logic device (PLD), the target PLD programmed to implement an electronic circuit design and the target PLD having a number of target I/O terminals, wherein the electronic circuit design includes inaccessible nodes that are not connected to any of the target I/O terminals, said apparatus comprising:

means for coupling the target PLD to an external circuit in which the target PLD is designed to operate;

a shadow PLD programmed to emulate the target PLD so as to provide emulated inaccessible nodes corresponding to the inaccessible nodes in the target PLD, the shadow PLD having a number of shadow I/O terminals, wherein a first set of the shadow I/O terminals emulate a first set of the target I/O terminals and a second set of the shadow I/O terminals coupled to the emulated inaccessible nodes;

a first set of electrical connections between the first set of shadow I/O terminals and the first set of target I/O terminals;

a measurement probe connector for coupling to external measurement instruments; and a second set of electrical connections coupling the target I/O terminals and the second set of shadow I/O terminals to the measurement probe connector.

2. The apparatus of claim 1 wherein the number of shadow I/O terminals is at least as large as the number of target I/O terminals.

3. The apparatus of claim 1 wherein the shadow PLD is programmed to physically emulate the target PLD by constraining placement of electronic circuit design in the shadow PLD to substantially physically match placement of the electronic circuit design in the target PLD.

4. The apparatus of claim 1 wherein the shadow PLD is programmed to parametrically emulate the target PLD by constraining timing of critical paths in the shadow PLD to substantially match timing of critical paths in the target PLD.

5. The apparatus of claim 1 wherein the shadow PLD further comprises internal evaluation circuitry coupled to the electronic circuit design in addition to the electronic circuit design implemented in the target PLD.

6. The apparatus of claim 1 further comprising instrumentation coupled to the measurement probe connector for providing analysis data streams to the electronic circuit design implemented in the shadow PLD.

7. The apparatus of claim 1 further comprising run control instrumentation coupled to some of the second set of shadow I/O terminals for providing control signals to the shadow PLD.

8. A method for analyzing a target programmable logic device (PLD) having a number of programmable circuit blocks, a plurality of inaccessible internal nodes, and a plurality of I/O terminals, wherein the inaccessible internal nodes are inaccessible to the I/O terminals when the target PLD is programmed, the method comprising the steps of:

(1) coupling the I/O terminals of the target PLD to an external circuit with which it is intended to operate;

(2) providing a shadow PLD having at least the same number of programmable circuit blocks as the target PLD, the shadow PLD having a plurality of shadow I/O terminals wherein at least some of the shadow I/O terminals are coupled to I/O terminals of the target PLD;

(3) programming the shadow PLD to substantially emulate the number of programmable circuit blocks and the plurality of inaccessible internal nodes of the target PLD, wherein the step of programming is performed so that at least some of the shadow I/O terminals are electrically coupled to the inaccessible internal nodes of the shadow PLD.

9. The method of claim 8 further comprising:

(4) operating the external circuit to drive both the target PLD and the shadow PLD.

10. The method of claim 8 wherein step (3) further comprises specifying timing constraints so as to force the emulated electronic circuit in the shadow PLD to parametrically match the electronic circuit implemented in the target PLD.

11. The method of claim 8 wherein the target PLD and the shadow PLD comprise field programmable gate arrays (FPGAs).

* * * * *